United States Patent
Maeda et al.

(10) Patent No.: US 7,759,227 B2
(45) Date of Patent: Jul. 20, 2010

(54) SILICON SEMICONDUCTOR SUBSTRATE HEAT-TREATMENT METHOD AND SILICON SEMICONDUCTOR SUBSTRATE TREATED BY THE METHOD

(75) Inventors: Susumu Maeda, Kanagawa (JP); Takahisa Sugiman, Kanagawa (JP); Shinya Sadohara, Kanagawa (JP); Shiro Yoshino, Kanagawa (JP); Kouzo Nakamura, Kanagawa (JP)

(73) Assignee: Sumco Techxiv Corporation, Kanagawa (JP)

( * ) Notice: Subject to any disclaimer, the term of this patent is extended or adjusted under 35 U.S.C. 154(b) by 637 days.

(21) Appl. No.: 11/578,814

(22) PCT Filed: Apr. 22, 2005

(86) PCT No.: PCT/JP2005/007716

§ 371 (c)(1),
(2), (4) Date: Oct. 19, 2006

(87) PCT Pub. No.: WO2005/104208

PCT Pub. Date: Nov. 3, 2005

(65) Prior Publication Data

US 2007/0252239 A1 Nov. 1, 2007

(30) Foreign Application Priority Data

Apr. 23, 2004 (JP) ............................. 2004-128841

(51) Int. Cl.
*H01L 21/322* (2006.01)
*H01L 29/167* (2006.01)
(52) U.S. Cl. .................... 438/471; 438/473; 257/607; 257/E21.318
(58) Field of Classification Search .............. 438/471, 438/473; 257/607, E21.318
See application file for complete search history.

(56) References Cited

U.S. PATENT DOCUMENTS

2002/0179006 A1 * 12/2002 Borgini et al. ................ 117/95

FOREIGN PATENT DOCUMENTS

| EP | 0 942 078 A1 * | 9/1999 |
|----|----|----|
| JP | 2002-110683 | 4/2002 |
| JP | 2002-524852 | 8/2002 |
| JP | 2003-007711 | 1/2003 |
| JP | 2003-077925 | 3/2003 |

(Continued)

OTHER PUBLICATIONS

Akatsuka, M. et al. "Effect of Rapid Thermal Annealing on Oxygen Precipitation Behavior in Silicon Wafers", *Jpn. J. Appl. Phys.* vol. 40, pp. 3055-3062, 2001.
Itoh, T. and Abe, T. "Diffusion Coefficient of a Pair of Nitrogen Atoms in Float-Zone Silicon", *Appl. Phys. Lett.*, vol. 53, No. 1, pp. 39-41, 1988.

(Continued)

*Primary Examiner*—Hsien-ming Lee
(74) *Attorney, Agent, or Firm*—Occhiuti Rohlicek & Tsao LLP

(57) ABSTRACT

A method is provided capable of universally controlling the proximity gettering structure, the need for which can vary from manufacturer to manufacturer, by arbitrarily controlling an M-shaped distribution in a depth direction of a wafer BMD density after RTA in a nitrogen-containing atmosphere. The heat-treatment method is provided for forming a desired internal defect density distribution by controlling a nitrogen concentration distribution in a depth direction of the silicon wafer for heat-treatment, the method including heat-treating a predetermined silicon wafer used for manufacturing a silicon wafer having a denuded zone in the vicinity of the surface thereof.

6 Claims, 14 Drawing Sheets

FOREIGN PATENT DOCUMENTS

JP          2004-111732      4/2004
WO          WO 00/13226      3/2000

OTHER PUBLICATIONS

Falster, R. et al., "On the Properties of the Intrisic Point Defects in Silicon: A Perspective from Crystal Growth and Wafer Processing", *Phys. Stat.sol.*, (b) 222, pp. 219-244, 2000.

Nakamura, K. et al., "Diffusion Coefficient and Equilibrium Concentration of Point Defects in Silicon Crystals Estimated via Grown-in Defect Behavior", *Solid State Phenomena*, vols. 82-84, pp. 25-34, 2002.

Voronkov, V.V. "Formation of Voids and Oxide Particles in Silicon Crystals", *Materials Science and Engineering*, B73, pp. 69-76, 2000.

International Search Report, PCT/JP2005/007716, Aug. 2005.

* cited by examiner

SILICON SEMICONDUCTOR SUBSTRATE HEAT-TREATMENT METHOD AND SILICON SEMICONDUCTOR SUBSTRATE TREATED BY THE METHOD

CROSS-REFERENCE TO RELATED APPLICATIONS

This application is the National Stage of International Application No. PCT/JP2005/007716, filed on Apr. 22, 2005, which claims the benefit of Japan Application Serial No. 2004-128841, filed on Apr. 23, 2004. The contents of both of the foregoing applications are hereby incorporated by reference in their entirety.

TECHNICAL FIELD

The present invention relates to a silicon semiconductor substrate for forming an integrated circuit, which is obtained from a single silicon crystal, and to a heat-treatment method of controlling defect density distribution in a depth direction of a silicon semiconductor substrate.

BACKGROUND ART

Silicon semiconductor substrates (wafers) used in devices such as semiconductor integrated circuits have been produced from single silicon crystals based mainly on a Czochralski process (CZ process). The CZ process is a technique for growing a single crystal by immersing a seed crystal in a quartz crucible in a silicon melt, and then pulling it upwards and out of the melt. From the quartz crucible holding the silicon melt, oxygen enters into the single silicon crystal based on the CZ process. The oxygen sufficiently dissolves into the crystal when the temperature is high just after the solidification. Since the high temperature immediately proceeding crystal solidification is cooled, and the solubility of the crystal is rapidly decreased, the oxygen incorporated inside the crystal is usually in a supersaturated state.

The oxygen incorporated in the supersaturate state within the wafer obtained from the above single crystal is then precipitated as an oxide by heat-treatment in the subsequent device manufacturing step. If the precipitate (an oxide) thereof is developed at a device forming region in a surface layer of the wafer, the performance of the device may be inhibited. On the other hand, the precipitate developed in the interior of the silicon substrate is called BMD (bulk micro defect), and acts effectively as a gettering source for trapping heavy metal impurity that enters into the silicon substrate in the device manufacturing step and deteriorates the performance thereof. The gettering method using the BMD is particularly called intrinsic gettering, and widely employed as a gettering method of harmful heavy metals. The BMD is required to exist at a density of a certain degree or more in order to act effectively as a gettering source. However, the BMD existing at too high density has the disadvantage of reducing the mechanical strength of the substrate, and the like.

With regard to the above device manufacturing step, there has been proposed a heat-treating cycle of bringing the device forming region of the wafer surface layer into a denuded state, and allowing the BMD as a gettering source to be developed in the interior thereof at an effective density. Its representative technique is as follows. (a) A portion used as a no defect layer, namely a denuded layer called a denuded zone (hereinafter referred to as DZ) is formed on the surface by subjecting a wafer to oxygen out-diffusion treatment of heating for 5 to 100 hours at high temperatures of 1100° C. or above in an oxidizing atmosphere. Subsequently, (b) the wafer is heated at low temperatures of 600° C. to 750° C., thereby forming an effective precipitation nucleus in the interior of the wafer. Thereafter, (c) the wafer is heat-treated at middle temperatures of 1000° C. to 1150° C. or at high temperatures, and a BMD is grown in the precipitation nucleus so as to ensure a gettering source. The above heat treatment cycle of (a) to (c) is a treatment method called "high-low-high or high-low-middle" cycle. However, this treatment method requires much time, and its productivity is not necessarily superior.

Recently, instead of the above-mentioned heat treatment that is complicated and time-consuming, there have been proposed rapid thermal annealing (RTA) techniques capable of imparting a similar wafer depth direction structure of a BMD. These techniques can terminate a heat treatment in a very short time, namely an order of seconds, and can also suppress non-uniformity of precipitate due to variations in the thermal history and oxygen concentration of a crystal, which have caused variations in BMD density. It is known that, by carrying out a heat-treatment of growing a BMD through an Ar atmosphere RTA, in which an argon (Ar) atmosphere (hereinafter referred to as "Ar atmosphere") is used at the time of the RTA, a DZ having a sufficient depth can be ensured in the surface layer of the wafer, enabling a high density BMD to be developed in the interior of the wafer. The form of distribution of this BMD can be called "reverse-U-shaped distribution" from its shape. There has been disclosed (for example, in Japanese Patent Unexamined Publication No. 2002-110683) that in the BMD distribution obtained from this Ar atmosphere RTA, the depth of a DZ and the density of the internal BMD can be controlled by controlling the holding temperature, holding time, and cooling rate from the holding temperature in the RTA. With the technique disclosed in this publication, however, the BMD density in a region near a device forming region in a wafer surface layer is not high, and a region where a BMD serving as a gettering source of a harmful heavy metal exists at a high density is present apart from the surface layer. It is therefore difficult to obtain proximity gettering effect that is highly desired by device manufacturers in the recent years. Specifically, because the tendency of low temperatures in a device process reduces the diffusion rate of a heavy metal that has contaminated a device forming region, the device manufacturers desire to form a BMD serving as a gettering source in a region as close as possible to the device forming region in the surface layer.

A silicon wafer having an ideal BMD distribution to meet the above desire is a silicon wafer in which a denuded layer having a sufficient depth is formed in its surface, and a BMD serving as a gettering source is formed at a high density in a position near its surface layer. In addition, it is desired that the density of the internal BMD is not too high, because too high BMD density in the interior of the wafer may cause the drawbacks such as a lowering of the mechanical strength of the substrate and the like, as described above. As contrasted to the reverse-U-shaped distribution in the Ar atmosphere RTA, such an ideal BMD distribution can be called an M-shaped distribution. The M-shaped distribution of the BMD can be obtained by an RTA in an atmosphere of nitriding gas such as $N_2$, $NH_3$ or the like, or in a mixed gas atmosphere of these nitriding gas, Ar (argon), $O_2$ (oxygen), $H_2$ (hydrogen), and the like. For example, after an RTA of rapid heating and cooling (for example, temperature increase or decrease of 50° C./sec) under an RTA holding temperature in a range of 800° C. to 1280° C., and an RTA holding time of from one second to five minutes, oxygen precipitation heat-treatment (for example, four hours at 800° C. plus 16 hours at 1000° C.) is carried out, so that a DZ is formed in the surface layer of a wafer, and high-density layers having the maximum BMD density are formed in the interior proximate to the DZ, and furthermore, low-density layers having the minimum BMD density are formed in the inside of these high-density layers (for example, refer to Japanese Patent Unexamined Publication No. 2003-7711). This publication describes that the above-mentioned maximum BMD density is set to $3.5 \times 10^9$ cm$^{-3}$ or more, and the above-mentioned minimum BMD density is set to $2.5 \times 10^8$ cm$^{-3}$ or less. Subsequently, a substrate material whose oxygen concentration is $11 \times 10^{17}$ atoms/cm$^3$ to $17 \times 10^{17}$ atoms/cm$^3$ is used and heated to 1100° C. to 1300° C. in a nitrogen-containing atmosphere by setting a rate of increase in temperature to 10 to 30° C./sec, and then an RTA process is carried out at a cooling rate of 1 to 25° C./sec, thereby enabling to manufacture a silicon semiconductor substrate in which the wafer surface is provided with a denuded layer having a depth of 10 µm or more, and the mid-portion in the wafer depth has a low BMD density and a region near the denuded layer in the surface has a high BMD density (for example, refer to the above-mentioned Japanese Patent Unexamined Publication No. 2002-110683 or 2003-7711).

Nevertheless, these publications disclose clearly neither the form of the M-shaped distribution of the BMD, that is, the maximum value of the BMD density and the distance from the wafer surface in the position indicating the value, nor a specific method of controlling the BMD density in the interior of the wafer to an arbitrary value. This seems to be because the most important factor in determining the M-shaped distribution of the BMD cannot be controlled accurately. Thus, these conventional techniques do not describe the method of controlling the BMD distribution to an arbitrary shape. It is therefore difficult for these techniques to individually meet the demands for proximate gettering functions of silicon wafers which can vary from manufacturer to manufacturer.

It is an object of the present invention to provide a silicon wafer in which, in an M-shaped distribution of BMD density in a depth direction of a wafer obtained by rapid thermal annealing in a nitrogen-containing atmosphere, the distribution form thereof is arbitrarily controlled, and also provide heat-treatment method for stably obtaining this silicon wafer.

DISCLOSURE OF THE INVENTION

The present inventors have considered the various effects of an M-shaped BMD distribution by nitrogen atmosphere RTA. Accordingly, they have discovered that the BMD distribution in the vicinity of the surface of a silicon wafer is similar to the concentration profile of nitrogen diffused inward from the atmosphere in the RTA into the silicon wafer, and hence they have found that this nitrogen contributes to the formation of the M-shaped distribution of the BMD. First, a description will be made of a difference in the BMD distribution form in a depth direction of the wafer due to a difference in the RTA atmosphere. FIG. 1 shows an example of the BMD distributions by the nitrogen atmosphere RTA. This shows a typical M-shaped distribution where high-density BMDs are formed in regions near the surface layer of the wafer, and the internal BMD density is low. In contrast, the use of Ar in the atmosphere leads to a distribution as shown in FIG. 2. This shows a typical reverse-U-shaped distribution where the BMD density in the interior of the wafer is high, and the density lowers gradually toward the surface layer, in contrast to cases in which nitrogen is used. It will thus be seen that the difference in the RTA atmosphere exerts a large influence on the BMD distribution and, in particular, the use of nitrogen enables the BMD density in the vicinity of the surface layer to be increased considerably.

Next, a description will be made of the relationship between the nitrogen diffusing inward from the atmosphere during the RTA into the silicon wafer, and the BMD density. FIGS. 3A and 3B show the relationship between the concentration of nitrogen diffused into the silicon wafer by the nitrogen atmosphere RTA, and the difference in the position in the depth direction of each silicon wafer at the BMD density after the nitrogen atmosphere RTA (BMD$_{N2}$) and the BMD density after the Ar atmosphere RTA (BMD$_{Ar}$). The data as shown in FIG. 3A was obtained by subjecting a wafer with an oxygen concentration of $13 \times 10^{17}$ atoms/cm$^3$ to an RTA process under a holding temperature (containing the concept of holding temperature range) of 1150° C. to 1250° C., and a holding time of 10 to 90 sec. In order to examine the cooling rate dependency of the RTA on the above-mentioned relationships, experiments of the two cooling rate levels (90° C./sec and 10° C./sec) were conducted under several holding temperature and holding time conditions. Furthermore, in order to examine the influence of the oxygen concentration of the wafer, experiments were conducted under a holding temperature of 1250° C., a holding time of 30 sec, and a cooling rate of 90° C./sec, while changing the oxygen concentration to three values ($15 \times 10^{17}$ atoms/cm$^3$, $13 \times 10^{17}$ atoms/cm$^3$, and $11 \times 10^{17}$ atoms/cm$^3$), respectively, as shown in FIG. 3B. The respective BMD densities in difference of the BMD density were found from the same RTA condition. The concentration of nitrogen diffused into the wafer by the nitrogen atmosphere RTA was measured on an SIMS (secondary ion mass spectroscopy). Each BMD density difference (BMD$_{N2}$–BMD$_{Ar}$) as shown in FIGS. 3A and 3B was found from the value of BMD in the interior of the wafer, excluding the area 40 µm from the surface of the silicon wafer. This is, as will be described later, because in the wafer surface layer in which vacancy concentration is lowered by the out-diffusion of the vacancies during the rapid cooling in the RTA, the vacancy trap effect of nitrogen exerting a large influence on the generation of a BMD is reduced rapidly, and hence cooling rate dependency occurs in the BMD density. Referring to FIGS. 3A and 3B, the injection of nitrogen in an amount of $1 \times 10^{14}$ atoms/cm$^3$ or more increases the BMD density difference, and that the correlation between the nitrogen concentration and the BMD density difference can be recognized. It can also be seen that this relationship depends on neither the cooling rate of the RTA nor the oxygen concentration of the wafer. These show the increase in the BMD density in the vicinity of the wafer surface due to the nitrogen atmosphere RTA, appear in the nitrogen concentration of the penetrated portion is $1 \times 10^{14}$ atoms/cm$^3$ or more, and depends only on the nitrogen concentration. The holding temperature and the holding time of the RTA determine the concentration distribution of nitrogen diffusing inward from the atmosphere into the wafer, and therefore the influence of these RTA conditions on the relationship between the BMD density difference and the nitrogen concentration, as shown in FIGS. 3A and 3B, can be reflected on the nitrogen concentration. Consequently, the BMD density in the vicinity of the surface layer in the nitrogen atmosphere RTA can be controlled to any arbitrary value irrespective of the cooling rate, under control of the concentration distribution of nitrogen diffusing inward into the wafer, by the holding temperature, the holding time, and the partial pressure of nitrogen in the atmosphere in the RTA.

As an example, a reference is made to FIG. 4. FIG. 4 showing the results of experiments for controlling the concentration distribution of nitrogen diffusing inward into the wafer by using a mixed gas of Ar and nitrogen in an RTA atmosphere, while changing the partial pressure of nitrogen in the mixed gas. The partial pressure of nitrogen was set to 0%, 0.2%, 0.5%, 1%, and 100%, respectively. The holding temperature was 1250° C., the holding time was 30 sec, and the cooling rate from the holding temperature was 60° C./sec in the RTA, which were standardized. The nitrogen concentration was measured after the RTA on an SIMS (secondary ion mass spectroscopy). It will be seen from FIG. 4 that in the nitrogen-containing atmosphere, the nitrogen concentration is high on the surface layer side and it decreases gradually toward the interior. Furthermore, in the range of 100 μm from the wafer surface, a higher partial pressure of nitrogen leads to a higher nitrogen concentration. These indicate that nitrogen diffuses during the RTA from the atmosphere to the interior of the wafer, and the amount of nitrogen diffusing to the vicinity of the wafer surface layer increases as the partial pressure of nitrogen increases, and hence that the nitrogen concentration can be controlled arbitrarily by the partial pressure of nitrogen. The reason why the nitrogen concentration decreases in the uppermost surface of the wafer is the out-diffusion of nitrogen during the rapid cooling in the RTA. On the other hand, in a nitrogen-free (0% in the partial pressure of nitrogen) atmosphere, no nitrogen is detected after the RTA. This example is a case in which the nitrogen concentration in the vicinity of the surface layer is controlled by the partial pressure of nitrogen in the atmosphere. This nitrogen concentration is closely matched with the results of calculations by using an equation of diffusion to be described later. That is, the movement of nitrogen is diffusion limited, and hence it can be controlled easily by the holding temperature and holding time and so on of the RTA.

The followings are examples of findings of calculations of the concentration of nitrogen diffusing inward by the RTA. First, it is necessary to determine the nitrogen concentration in the surface as a boundary condition. FIG. 5 shows the relationship between the thermal equilibrium concentration of nitrogen in a silicon crystal and the partial pressure of nitrogen in the RTA atmosphere, which was determined by the present inventors. The plots in FIG. 5 are the nitrogen concentrations in the vicinity of the silicon wafer surface, which were evaluated on the SIMS after an RTA process in which the partial pressure of nitrogen was changed in an atmosphere of a mixed gas of Ar and nitrogen (the holding temperatures were 1250° C., 1200° C., and 1100° C., and the holding time in common was 30 sec). As a boundary condition of calculation, it is possible to give the lines indicated in FIG. 5, namely thermal equilibriums Ceq expressed by the following equations (1) and (2):

$$p > 0.01$$

$$Ceq = 3.42 \times 10^{17} \exp(-0.62 \text{ eV}/kT)[\text{cm}^{-3}] \quad (1)$$

$$P \leq 0.01$$

$$Ceq = 3.42 \times 10^{18} P^{1/2} \exp(-0.62 \text{ eV}/kT) \quad (2)$$

Here, the respective variables are defined as follows.

P is a partial pressure of nitrogen, and P=1.0 when nitrogen ($N_2$) is 100%; k is Boltzmann constant, particularly, $8.6171 \times 10^{-5}$ [eV/K]; and T is the absolute temperature [K].

Next, a diffusion constant is required in calculation. The equation (3) described in the literature [T. Itoh, T. Abe, Appl. Phys. Lett. Vol. 53 (1988) page 39] is employed.

$$D = 2.7 \times 10^3 \exp(-2.8 \text{ eV}/kT)[\text{cm}^2/\text{sec}] \quad (3)$$

FIG. 6 shows the concentration distribution of nitrogen diffusing from the nitrogen atmosphere of the RTA into the wafer, calculated by using the above equations, and the concentration distribution of measured nitrogen (measured on the SIMS). The RTA conditions were a holding temperature of 1250° C., a holding time 30 seconds, a cool rate of 60° C./sec from the holding temperature, and a nitrogen partial pressure of 1% in the atmosphere. This shows that the in-diffusion behavior of nitrogen obtained from the calculation was capable of closely reproducing the measured value. Thus, the concentration of nitrogen diffusing into the wafer from the RTA atmosphere can also be easily estimated by calculation from the holding temperature, holding time, and partial pressure of nitrogen in the atmosphere of the RTA. Consequently, its estimation is easy and controllable accurately in an actual process.

Next, a description will be made of the relationship between the concentration of nitrogen diffusing inward by the nitrogen atmosphere RTA and the corresponding BMD density. The difference in the position in the depth direction of each silicon wafer between the BMD density after the nitrogen atmosphere RTA ($BMD_{N2}$) and the BMD density after the Ar atmosphere RTA ($BMD_{Ar}$), as shown in FIGS. 3A and 3B, occurs in the area where the nitrogen concentration penetrates $1 \times 10^{14}$ atoms/cm$^3$ or more, and depends only on the nitrogen concentration. The holding temperature and the holding time of the RTA determine the concentration distribution of nitrogen diffusing inward from the atmosphere into the wafer, and therefore the influence of these RTA conditions on the relationship between the BMD density difference and the nitrogen concentration, as shown in FIGS. 3A and 3B, can be reflected on the nitrogen concentration. On the other hand, it is known as described below that the BMD density ($BMD_{Ar}$) in the Ar atmosphere has a strong correlation with the concentration of vacancy ($C_V$) remaining within the wafer after the RTA. For example, in Japanese Patent Unexamined Publication No. 2002-524852 (the patent to MEMC) and R. Falster et al., Phys. Stat. sol. (b) 222, 219 (2000), a value $C_V$ is found experimentally by platinum diffusion method, and the value is associated with the BMD density. In the literature of M. Akatsuka et al., Jpn. J. Appl. Phys. Vol. 40 (2001) pp. 3055, and the literature of R. Falster et al., Phys. Stat. sol. (b) 222,219 (2000), a value $C_V$ is found by numerically calculating diffusion annihilation behavior of vacancies and interstitial silicon atoms, and the relationship between this value and the BMD density is rearranged. The deriving of the $C_V$ by numerical calculation is relatively simple compared to an experimental technique, such as platinum diffusion method. However, the calculation results vary depending on the physical values used, and hence greatly influences the accuracy of the calculations. In the present invention, an accurate residual vacancy concentration $C_V$ after RTA can be obtained by numerical calculation with the use of a point defect physical value, as described in Solid State Phenomena 82-84 (2002) 25 by K. Nakamura, T. Saishoji, and J. Tomioka, who are including in the present inventors. Its method will be described below. First, as a boundary condition, it is assumed that vacancies and interstitial silicon atoms of thermal equilibrium concentration are introduced into the surface of a silicon wafer during the RTA process. Assume that these thermal equilibrium concentrations are functions depending only on temperature, the thermal equilibrium concentration of vacancies ($C_V^{eq}$) and that of interstitial silicon atoms ($C_I^{eq}$) can be expressed by the following equations (4) and (5):

$$C_V^{eq} = 6.5 \times 10^{14} \exp(-3.94 \text{ eV}/k(1/T - 1/T_{mp})) \quad (4)$$

$$C_I^{eq} = 4.8 \times 10^{14} \exp(-4.05 \text{ eV}/k(1/T - 1/T_{mp})) \quad (5)$$

In this equation, T is the absolute temperature [K], and $T_{mp}$ is the melting point of silicon (1685 [K]). At the respective temperatures of the RTA, the vacancies and the interstitial silicon atoms introduced at the thermal equilibrium concentrations into the wafer surface diffuse and move according to their respective concentration gradients developed in the interior of the wafer. This diffusion behavior is governed by the diffusion constant of vacancies ($D_V$) and the diffusion constant of interstitial silicon atoms ($D_I$). There were used ones that can be expressed by the following expressions (6) and (7)

$$D_V = 4.5 \times 10^{-5} \exp(-0.3 \text{ eV}/k(1/T - 1/T_{mp})) \quad (6)$$

$$D_I = 5.0 \times 10^{-4} \exp(-0.9 \text{ eV}/k(1/T - 1/T_{mp})) \quad (7)$$

Furthermore, the introduced vacancies and interstitial silicon atoms are reduced in their respective concentrations due to annihilation. It is assumed that this annihilation reaction can be indicated by a reaction constant of annihilation reaction expressed by the following equation (8):

$$K_{IV} = 4\pi(D_V + D_I)a_c \exp(-\Delta G_{IV}/kT) \quad (8)$$

In this formula, $a_c$ is a critical distance at which annihilation reaction is occurred, and $\Delta G_{IV}$ is barrier energy of annihilation. Based on these equations, the diffusion of point defect and annihilation reaction in the RTA can be expressed by the following equation (9):

$$\frac{\partial C_{I,V}}{\partial t} = -\nabla(-D_{I,V}\nabla C_{I,V}) - K_{I,V}(C_V C_I - C_V^{eq} C_I^{eq}) \quad (9)$$

The vacancy concentration $C_V$ remaining within the wafer after the RTA process in Ar atmosphere can be derived by uniformly giving, as an initial condition, the thermal equilibrium concentrations of vacancies and interstitial silicon atoms corresponding to the initial temperature of the RTA, in a depth direction of the wafer, and then performing a numerical calculation of Equation (9) in response to the progress of the RTA process, namely the change of the wafer temperature. FIG. 7 shows an example of the relationship between the $C_V$ found from the above numerical calculation, and the corresponding measured BMD density in the Ar atmosphere. The BMD densities as shown in FIG. 7 are data obtained from the RTA process conducted by changing the holding temperature (1150° C., 1200° C., and 1250° C.), the holding time (10 sec, 20 sec, and 30 sec), and the cooling rate (90° C./sec, and 10° C./sec), respectively. This shows that the BMD densities in the Ar atmosphere are closely correlated with the $C_V$ obtained from the calculation, thus enabling to estimate the BMD density with respect to the holding temperature, the holding time, and the cooling rate in the RTA.

From the above-mentioned relationship between $BMD_{Ar}$ and $C_V$, and the previously described relationship between $BMD_{N2} - BMD_{Ar}$ and nitrogen concentration, the relationship between the BMD density in the nitrogen atmosphere ($BMD_{N2}$) and the nitrogen concentration can be related by one-to-one correspondence. Since nitrogen diffuses inward into the wafer from the atmosphere during the RTA process, it can be found from the calculation of the holding temperature, the holding time, and the partial pressure of nitrogen in the atmosphere during the RTA, as described above, thus enabling to easily control the BMD density at an arbitrary position in the depth direction of the wafer. Especially, in the vicinity of the wafer surface, the BMD density due to the Ar atmosphere becomes extremely low, and hence the BMD density due to the nitrogen atmosphere can be determined only by the nitrogen concentration.

From the foregoing, it is clear that strict control of the BMD density distribution in the vicinity of the surface layer of the wafer can be achieved by controlling the concentration of nitrogen diffusing inward into the wafer. Since it is easy to control the nitrogen concentration distribution by controlling the holding temperature, the holding time, and the partial pressure of nitrogen in the RTA, the BMD density in the vicinity of the surface layer by the nitrogen atmospheric RTA can be substantially controlled into an arbitrary shape.

Next, the control of the BMD density in the interior of the silicon wafer in the present invention will be described below. It can be seen from FIGS. 3A and 3B that, when the nitrogen concentration is $1 \times 10^{14}$ atoms/cm$^3$ or less, there is no difference between the BMD density in the nitrogen atmosphere RTA, and that in the Ar atmosphere. This shows that any BMD caused by nitrogen is not developed in the area where the in-diffusion of nitrogen does not reach the interior of the wafer during the RTA that is a short-time process. Hence, the BMD density of this area is the same as that in the Ar atmosphere. These are governed by a residual vacancy concentration determined by the out-diffusion and annihilation during a rapid cooling of vacancies and interstitial silicon atoms of thermal equilibrium concentrations which were introduced during the high-temperature retention in the RTA, as will be described later. Therefore, the BMD density in the interior of the wafer may be controlled with the holding temperature and the cooling rate in the RTA (for example, refer to Japanese Unexamined Patent Publication No. 2002-110683).

Next, the control of the depth of a DZ will be described below. The DZ may be controlled by the cooling rate of the RTA, as described in this publication No. 2002-110683. The BMD density in the vicinity of the wafer surface layer depends greatly on the vacancy trap state due to nitrogen in the rapid cooling in RTA, as will be described later. Accordingly, the cooling rate of the RTA becomes an important control parameter in controlling the BMD density in the vicinity of the surface layer, namely the depth of the DZ. Here, a case where the DZ is controlled by the cooling rate is shown in FIG. 8. The conditions of the RTA were 1250° C. in holding temperature, and 30 sec in holding time. The atmosphere was a mixed atmosphere of Ar and nitrogen, and an experiment was conducted by changing the partial pressure of nitrogen in a range from 0.2% to 100%. It can be seen from FIG. 8 that the DZ is reduced as the cooling rate is increased for each partial pressure of nitrogen. Accordingly, it can be seen that the DZ can be controlled by the cooling rate of the RTA, if the partial pressure of nitrogen in the atmosphere is determined. The following is the reason why a limited position in a depth direction of a wafer in the nitrogen concentration is set to 10 μm from the surface in the invention as set forth in claim 7. That is, although it is desirable to limit the nitrogen concentration at the uppermost surface of the wafer with consideration to the convenience of evaluation of the nitrogen concentration, it is difficult to control the nitrogen concentration of the uppermost surface because the concentration is varied due to the out-diffusion of nitrogen during the cooling in RTA, and hence the position of 10 μm subjected to less variations during the cooling is proper as a limited position of the nitrogen concentration. In addition, the reason why the oxygen concentration of a silicon wafer used in the present invention is set to $9 \times 10^{17}$ atoms/cm$^{-3}$ to $17 \times 10^{17}$ atoms/cm$^{-3}$ is that, when the oxygen concentration is below $9 \times 10^{17}$ atoms/cm$^{-3}$, the mechanical strength of the wafer is lowered and slip is introduced into wafer during the RTA process, whereas when the oxygen concentration is above $17 \times 10^{17}$ atoms/cm$^{-3}$, the BMD density to be developed is excessive, making it difficult to ensure the DZ. Furthermore, in order to control the BMD distribution in the RTA using a nitrogen-containing atmosphere, it is desirable to set the following control factors to the following ranges. Preferably, the holding temperature in the RTA is 1100° C. to 1300° C. This is because when the holding temperature is below 1100° C., the amount of introduction of vacancies is extremely low, making it difficult to form the BMD, and when it exceeds 1300° C., it is difficult to avoid the development of slip in the substrate.

Preferably, the holding time in the RTA is in a range of 1 to 300 sec in order to determine the diffusion distance of nitrogen, while utilizing the advantage of the RTA that is a short-time process. Preferably, the partial pressure of nitrogen in the atmosphere is in a range of 0.1 to 1% as shown in FIG. 8, because when the partial pressure is too high, it is difficult to ensure the DZ. In addition, when the partial pressure is too high, a nitride film may be formed on the wafer surface, further roughening the wafer surface. Preferably, the cooling rate is in a range of 1 to 100° C./sec as shown in FIG. 8, because when the cooling rate is small, a deep DZ can be ensured, and when the cooling rate is too large, the temperature difference within the wafer surface is enormous, thus facilitating the occurrence of slip due to thermal stress.

Next, the reason why the RTA conducted in the nitrogen atmosphere can bring the BMD into an M-shaped distribution will be described with reference to the accompanying drawings, by comparison with an Ar atmosphere. FIG. 9A shows the distribution in a depth direction of a wafer (from the surface to the mid-portion) in the concentration of vacancy (hereinafter referred to as "$C_V$") of a silicon crystal, and the concentration of interstitial silicon atom (hereinafter referred to as "$C_I$") at the time of high-temperature retention in the Ar atmosphere RTA. The $C_V$ and $C_I$ during the high-temperature retention can be held at their respective thermal equilibrium concentrations in that temperature if the holding time is sufficiently long. This results in the distributions uniform in the depth direction of the wafer as shown in FIG. 9A. Upon termination of the high-temperature retention, the wafer is rapidly cooled at a cooling rate of several tens of ° C./sec, and during the rapid cooling, vacancies and interstitial silicon atoms are respectively reduced in concentration, due to annihilation and out diffusion. The interstitial silicon atoms diffuse quickly and hence the out-diffusion effect reaches the interior of the wafer, so that its concentration is lowered remarkably. In contrast, the vacancies diffuse slowly and hence the concentration in the vicinity of the surface layer is lowered due to out-diffusion, while remaining at high concentration in the interior of the wafer. Therefore, after the RTA, the vacancies remain within the wafer in the distribution form as shown in FIG. 9B. An generation of the nucleus of the BMD to be developed by the succeeding heat-treatment can be considered as a chemical species that is $O_2V$ consisting of the residual vacancy (v) and two oxygen atoms (O) [V. V. Voronkov Materials Science and Engineering B73 (2000) 69-76]. Accordingly, the BMD distribution in the Ar atmosphere RTA becomes the reverse-U-shape reflecting the $C_V$ distribution after the RTA, as shown in FIG. 10.

On the other hand, the case of nitrogen atmosphere is as follows. At the time of high-temperature retention, the $C_V$ and $C_I$ distributions are determined only by temperature, and hence they are identical to the case of the Ar. However, when nitrogen is used in the atmosphere, the nitrogen diffuses inward into the silicon wafer, resulting in the concentration distributions of $C_V$, $C_I$, and nitrogen, as shown in FIG. 11A. If cooled rapidly from this state, during the cooling, the nitrogen traps the vacancy and forms $N_2V$ during the cooling. Since the $N_2V$ acts as a supply source of vacancies to $O_2V$, it becomes an important chemical species, governing the BMD density. However, in the extreme vicinity of the surface of the wafer where $C_V$ is extremely low, it becomes difficult to retain vacancies as $N_2V$ (the dissociation of $N_2V$), so that the concentration of $N_2V$ is lowered. The concentration distribution of vacancies ($C_V$) having no relationship with nitrogen is identical to the case of the Ar. Consequently, the concentration distributions of $C_V$, $N_2V$, and nitrogen are in the forms as shown in FIG. 11B. A local drop of the nitrogen concentration in the extreme vicinity of the surface is caused by the out-diffusion during the cooling. The generation of the nucleus of the BMD by the succeeding heat treatment reflects the distribution of $N_2V$, and the distribution of $N_2V$ reflects the distribution of nitrogen concentration substantially immediately before starting the cooling, and as the result, the BMD distribution is an M-shaped distribution as shown in FIG. 12.

The formation of a DZ by the nitrogen atmosphere RTA will be described below. In the extreme vicinity of the surface layer of a wafer, vacancies immediately disappear to the outside of the wafer due to out-diffusion, during rapid cooling in the RTA. Therefore, in the extreme vicinity of the surface layer where the concentration of vacancies is lowered, the effect of trapping vacancies by nitrogen is weakened, and the concentration of $N_2V$ is also lowered. The amount of the out-diffusion of vacancies greatly depends upon the cooling rate as described above. Since the rapid cooling reduces the amount of the out-diffusion of vacancies, $N_2V$ can be generated up to the extreme vicinity of the surface layer of the wafer, resulting in a shallow DZ. On the other hand, since slow cooling increases the amount of out diffusion of vacancies, the region of generating $N_2V$ remains in the interior of the wafer, resulting in a deep. DZ. Thus, the DZ by the nitrogen atmosphere RTA can be controlled by the cooling rate.

Conventionally, it has been thought that the reason why the BMD density in the vicinity of the surface layer is increased by the RTA process in the nitrogen atmosphere is that injection of vacancies caused by nitriding of the wafer surface, and the vacancies contribute to the formation of the nucleus of a BMD. However, as discussed so far, the present invention shows that the main factor of the M-shaped distribution in the BMD density distribution is nitrogen diffusing from the atmosphere of the RTA into the wafer. Accordingly, the control of the BMD density distribution immediately below the DZ can be achieved by controlling the concentration of nitrogen diffusing inward into the silicon wafer. The nitrogen concentration distribution can be controlled easily with the holding temperature, holding time, and the partial pressure of nitrogen in the atmosphere in the RTA. Furthermore, the depth of the DZ in the wafer surface layer can be considered to correspond to the $N_2V$ concentration in the vicinity of the uppermost surface layer, as described above, and hence it can be controlled with the cooling rate and the partial pressure of nitrogen in the atmosphere in the RTA. Furthermore, the BMD density in the interior of the silicon wafer where the in-diffusion of nitrogen does not reach can be determined by the concentration of vacancies frozen within the silicon wafer after the RTA, and it is therefore controllable with the holding temperature and the cooling rate in the RTA.

More specifically, the present invention provides the followings.

According to a first aspect of the present invention, a silicon wafer includes a denuded layer in the vicinity of a surface thereof, in which after a heat-treatment using nitrogen or an atmospheric gas containing nitrogen, a nitrogen concentration at a position of 10 μm from the surface of the silicon wafer is $1\times10^{14}$ atoms/cm$^3$ or more.

As used herein, the term "the vicinity of a surface" can mean, for example, a range within about 20 μm from the surface, and preferably within about 15 μm, and more preferably within about 10 μm. In the case of a polished silicon wafer after subjecting this wafer to polishing, the surface as a reference of depth may be the surface of a silicon wafer before polishing. In the case of a silicon wafer after subjecting this wafer to epitaxial growth, it may be the surface of the silicon wafer before the epitaxial growth. The above-mentioned silicon wafer can be taken out of silicon manufactured mainly by so-called CZ method or MCZ method. The term "denuded layer" can mean such a layer that no defect is detected by LST (laser scattering tomography), a method of observing on a microscopy after etching, or the like. That is, it can be said to be a layer of substantially zero defects. A region lying on the side deeper than the denuded layer and being adjacent thereto does not belong to the denuded layer, but this region is sufficiently close to the denuded layer and, in particular, it may be within such a range that heavy metal impurities and the like contaminated the device forming region by the processing and treatment in the succeeding process can move to the BMD in this region. Preferably, a high nitrogen concentration is present at the region lying on the side deeper than the denuded layer and being adjacent thereto. A silicon wafer having a diameter of 200 mm is illustrated in an embodiment to be described later. Needless to say, the present invention is similarly applicable to ones having a smaller or larger diameter than 200 mm. For example, the present invention is applicable to a silicon wafer having a diameter of 300 mm.

According to a second aspect of the present invention, a heat-treatment method of heat-treating a predetermined silicon wafer for manufacturing a silicon wafer having a denuded layer in the vicinity of a surface thereof, the method for forming a desired internal defect density distribution by controlling a nitrogen concentration distribution in a depth direction of the silicon wafer for heat-treatment.

As used herein, the predetermined silicon wafer may be a suitable silicon wafer as material for manufacturing a silicon wafer having a denuded layer, and includes ones obtained by slicing an ingot prepared by CZ method or MCZ method.

In a third aspect of the heat-treatment method as described in the second aspect of the present invention, the above-mentioned heat-treatment method is carried out in an atmospheric gas containing at least gas containing a nitrogen component having a predetermined partial pressure, and the temperature is raised at a predetermined rate of increase in temperature, and after holding for a predetermined holding time in a predetermined holding temperature range, the temperature is lowered at a predetermined rate of decrease in temperature.

As used herein, the nitrogen component can contain a compound containing a nitrogen element. For example, it may contain a nitrogen gas, ammonia (NH$_3$), other compound, or a mixture of these. The holding temperature range may be of holding a constant temperature or holding a periodically or randomly changed temperature within this holding temperature range. The rate of increase in temperature or the rate of decrease in temperature (including a cooling rate) may be almost constant or may be varied within a certain range.

In a fourth aspect of the heat-treatment method as described in the third aspect of the present invention, the above-mentioned heat-treatment method previously determines a desired internal defect density distribution in a depth direction, and determines, after matching the internal defect density distribution and the nitrogen concentration distribution, the partial pressure of nitrogen, the rate of increase in temperature, the holding temperature range, the holding time, and the rate of decrease in temperature so as to be achieve the nitrogen concentration distribution.

A desired defect density distribution can be determined under specifications for processing and treatment in the subsequent step. Under the defect density distribution thus determined, the corresponding nitrogen concentration distribution can be determined. This association can be found previously from various experiments and/or theories or calculations. Since the nitrogen concentration distribution is more directly defined by the partial pressure of nitrogen, the temperature gradient to be raised, the holding temperature range and time, the temperature gradient to be lowered, it is easier than controlling the defect density distribution.

In a fifth aspect of the heat-treatment method as described in aspects two to four of the present invention, the nitrogen concentration distribution is of approximately M-shaped type in a depth direction.

In a sixth aspect of the present invention a heat-treatment method includes arbitrarily controlling a silicon wafer, in which a denuded layer of a sufficient depth is formed in the vicinity of a surface thereof and a high-density defect is formed at a position near the surface, in terms of a depth in the denuded layer and a defect density distribution in a depth direction in the interior of the wafer adjacent to the denuded layer.

In a seventh aspect of the heat-treatment method as described in the sixth aspect of the present invention, after a heat-treatment using an atmospheric gas containing at least a nitrogen component, nitrogen is penetrated so that a nitrogen concentration at a position of 10 μm from the surface of the silicon wafer is $1\times10^{14}$ atoms/cm$^3$ or more.

In an eighth aspect of the heat-treatment method as described in a seventh aspect of the present invention, a method using a silicon wafer taken out of a silicon single crystal whose oxygen concentration is $9\times10^{17}$ atoms/cm$^3$ to $17\times10^{17}$ atoms/cm$^3$, and including a rapid temperature-increasing-and-decreasing heat-treating step, in which the rapid temperature-increasing-and-decreasing heat-treating step includes a holding step of holding at a predetermined holding temperature for a predetermined holding time, the predetermined holding temperature is 1100° C. to 1300° C., the holding time is 1 to 300 seconds, the partial pressure of nitrogen in the predetermined atmospheric gas is 0.1 to 1%, and a rate of decrease in temperature from the holding temperature range is 1 to 100° C./sec.

In a ninth aspect of the present invention, a silicon wafer is treated by the heat-treatment method described in aspects two through eight.

While the present invention has been described and illustrated above, the features, property, and various advantages of the present invention will become more apparent from the accompanying drawings and the following detailed description of the present invention.

PREFERRED MODE FOR CARRYING OUT THE INVENTION

Preferred embodiments of the present invention will be described below with reference to the accompanying drawings. The present invention is however not limited to the preferred embodiments, and various modifications and changes can be made without departing from the scope of the present invention.

The preferred embodiments for carrying out the present invention will be described below with reference to the accompanying drawings.

Figure 13:
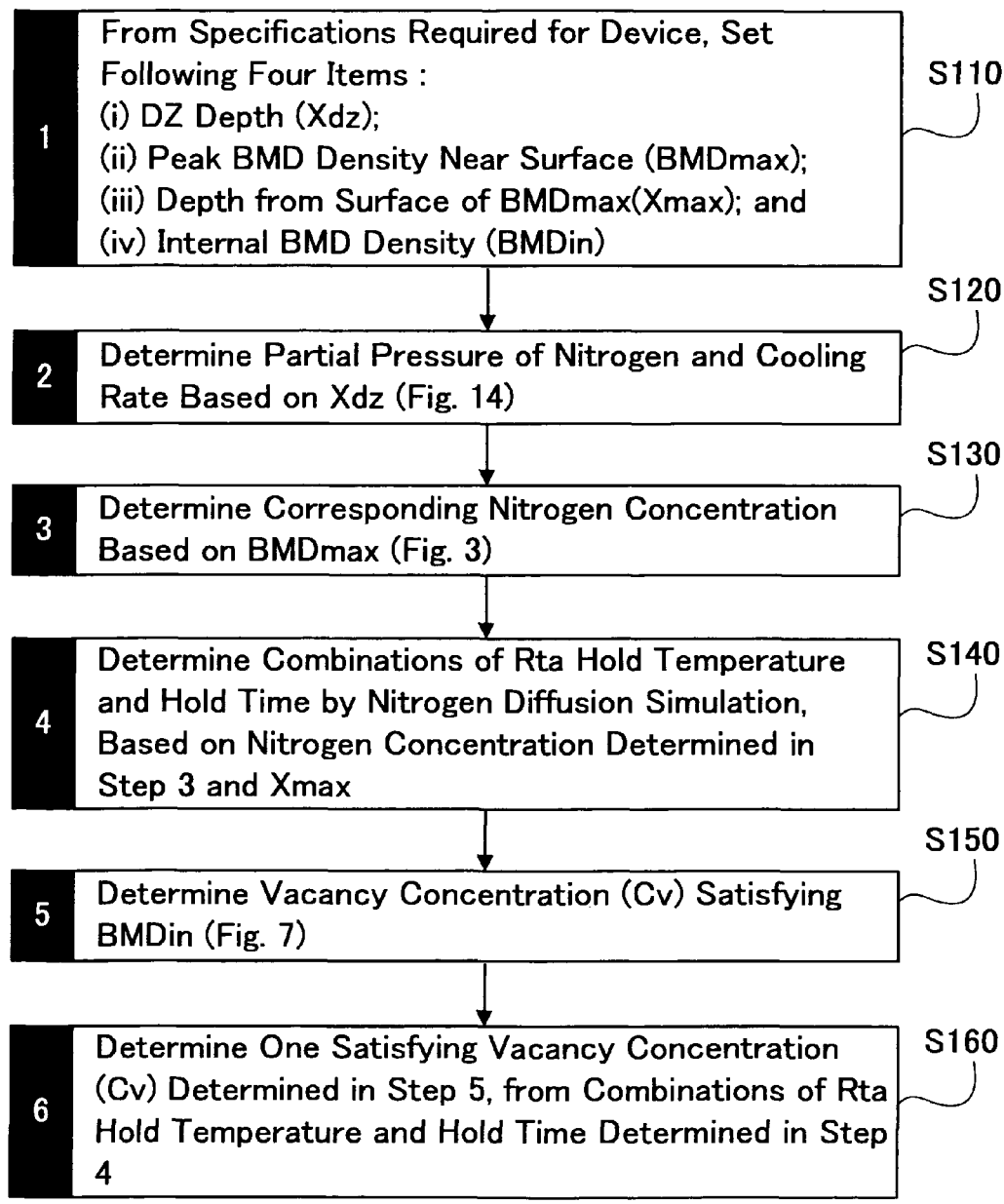
FIG. 13 is a flow chart showing a design procedure of a BMD density distribution.

The following is a specific method of designing an M-shaped distribution of BMD density according to the present invention. Although the method consisting of the following procedures is an example for producing an M-shaped distribution of BMD density by using the present invention, the method according to the present invention is not limited to this. All other methods theoretically or substantially resembling this can be contained in the present invention. FIG. 13 shows the above example in the form of a flow chart. First, the following four items are set from specifications required for a device (S110). (i) a DZ depth ($X_{dz}$), (ii) a peak BMD density in the vicinity of the surface ($BMD_{max}$), (iii) a depth from the surface of $BMD_{max}$ ($X_{max}$), and (iv) an internal BMD density ($BMD_{in}$).

Figure 14:
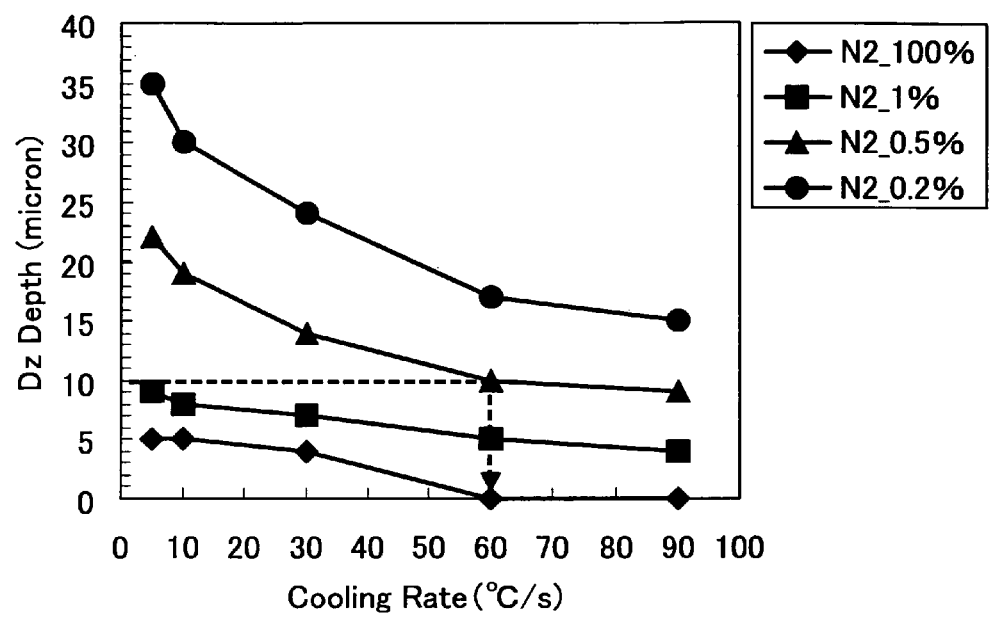
FIG. 14 is a diagram showing the relationship between the DZ depth, the cooling rate, and the partial pressure of nitrogen.

Next, from the DZ depth ($X_{dz}$), the partial pressure of nitrogen and a cooling rate are determined by using the relationship between the DZ depth, the cooling rate, and the partial pressure of nitrogen, as shown in FIG. 14 (S120). FIG. 14 illustrates a case in which, when the DZ depth ($X_{dz}$) is 10 μm, for example, setting the partial pressure of nitrogen to 0.5% determines that the cooling rate is 60° C./sec. At this time, if several ones having different partial pressures of nitrogen are prepared, a plurality of combinations of a partial pressure of nitrogen and a cooling rate can be obtained with respect to a certain DZ depth.

Figure 1:
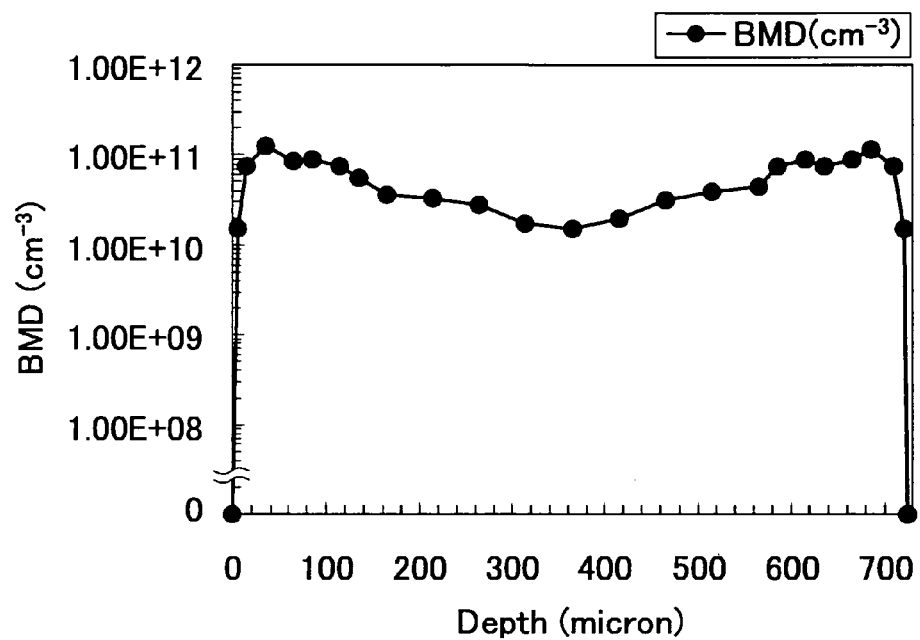
FIG. 1 is a diagram showing a typical example of a BMD density distribution in a depth direction of a silicon wafer in a nitrogen atmosphere.
Figure 2:
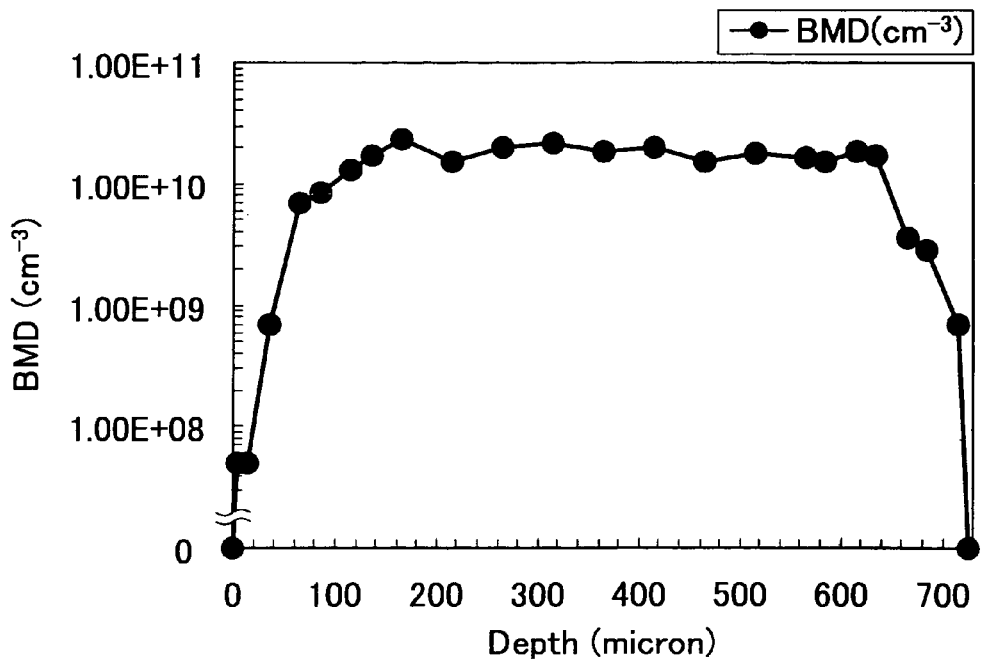
FIG. 2 is a diagram showing a typical example of a BMD density distribution in a depth direction of a wafer in an Ar atmosphere.
Figure 3A:
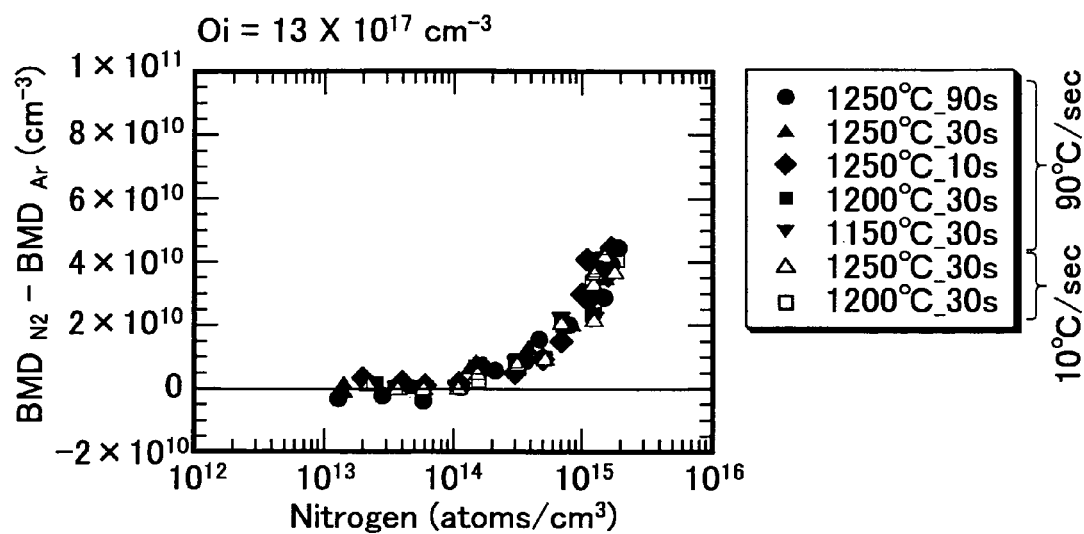
FIGS. 3A and 3B are diagrams showing the relationship between the concentration of nitrogen diffused into a silicon wafer by nitrogen atmosphere RTA, and the difference in a position in the depth direction of the respective silicon wafers between the BMD density after the RTA of nitrogen atmosphere ($BMD_{N2}$) and the BMD density after an Ar atmosphere RTA ($BMD_{Ar}$).
Figure 3B:
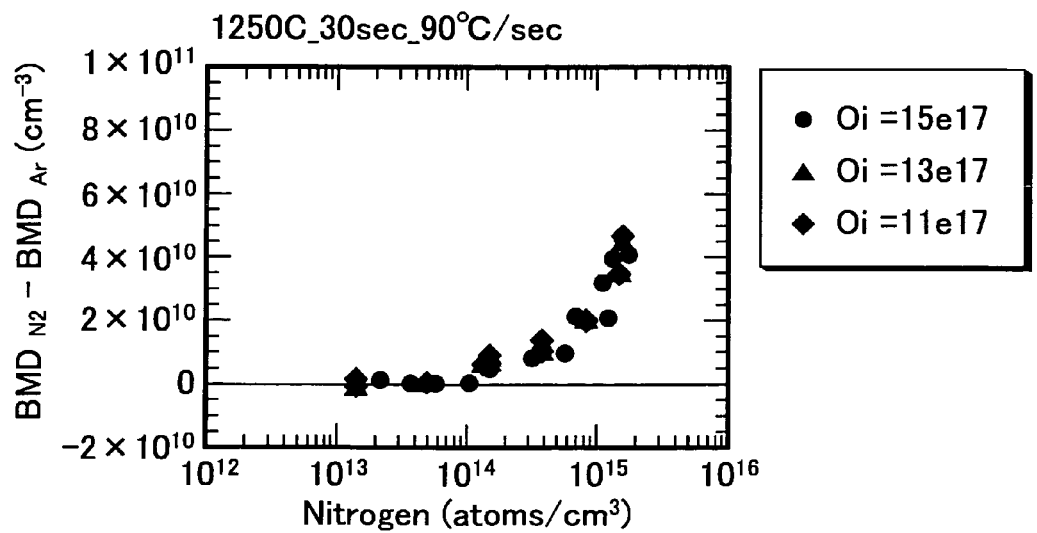
Figure 4:
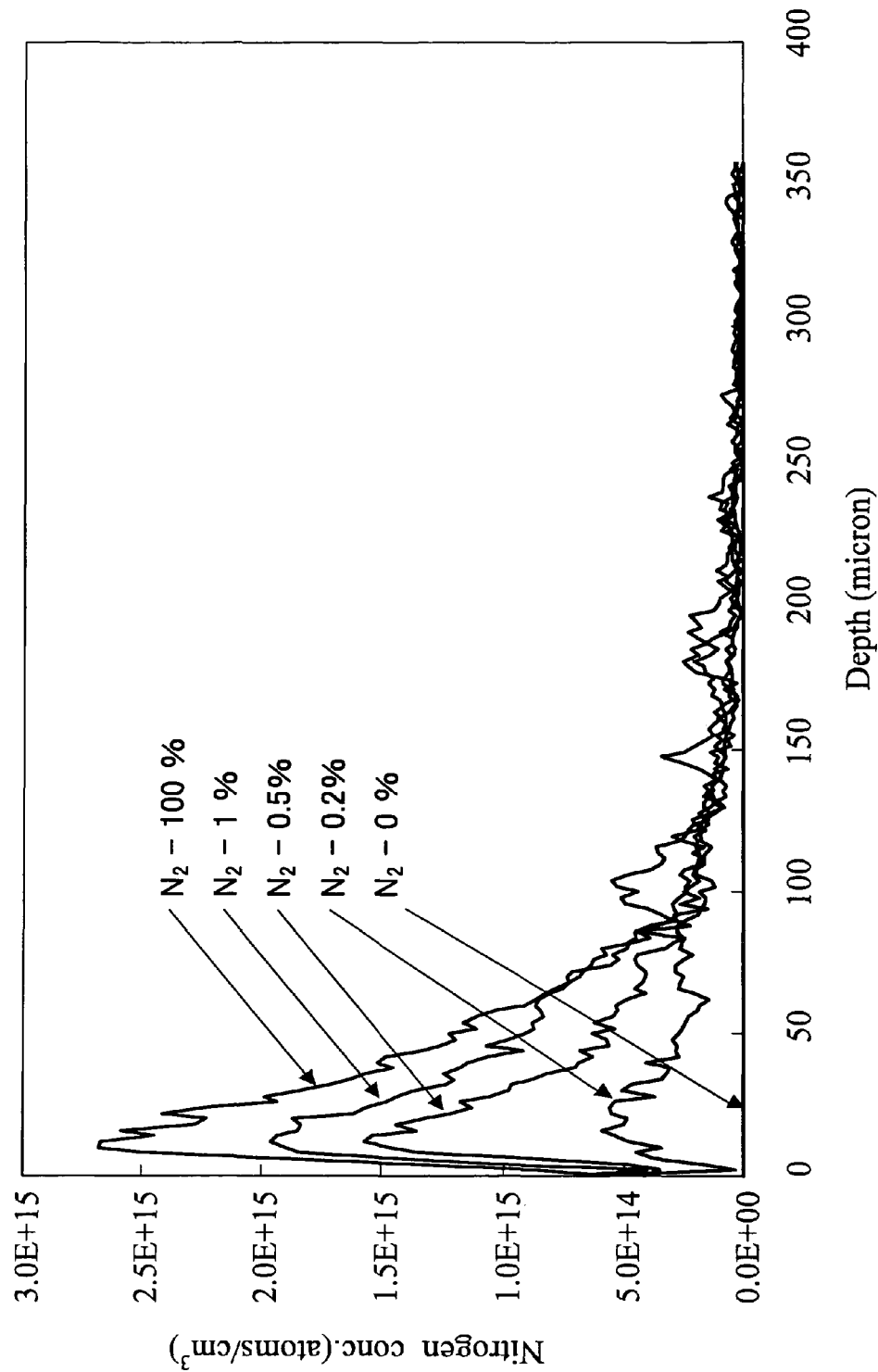
FIG. 4 is a diagram showing a nitrogen concentration distribution in a depth direction of a wafer measured on an SIMS; when changing a partial pressure of nitrogen.
Figure 5:
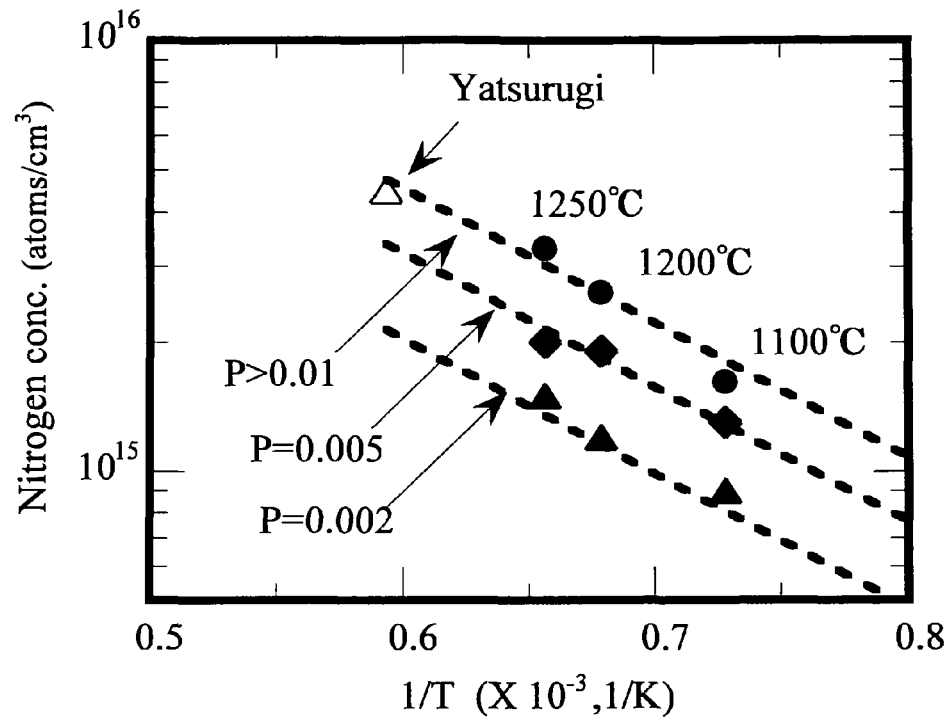
FIG. 5 is a diagram showing the relationship between the thermal equilibrium concentration of nitrogen in a silicon crystal and the temperature.
Figure 6:
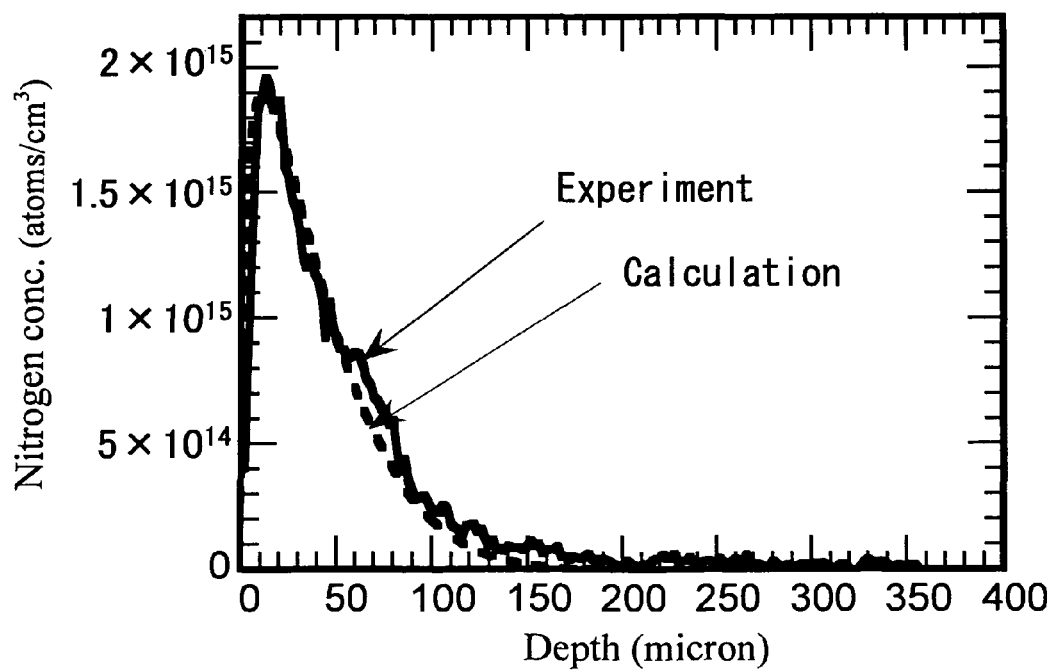
FIG. 6 is a diagram showing by comparison the calculated value and the measured value of a nitrogen concentration in a depth direction of a silicon wafer in a nitrogen atmosphere RTA.
Figure 7:
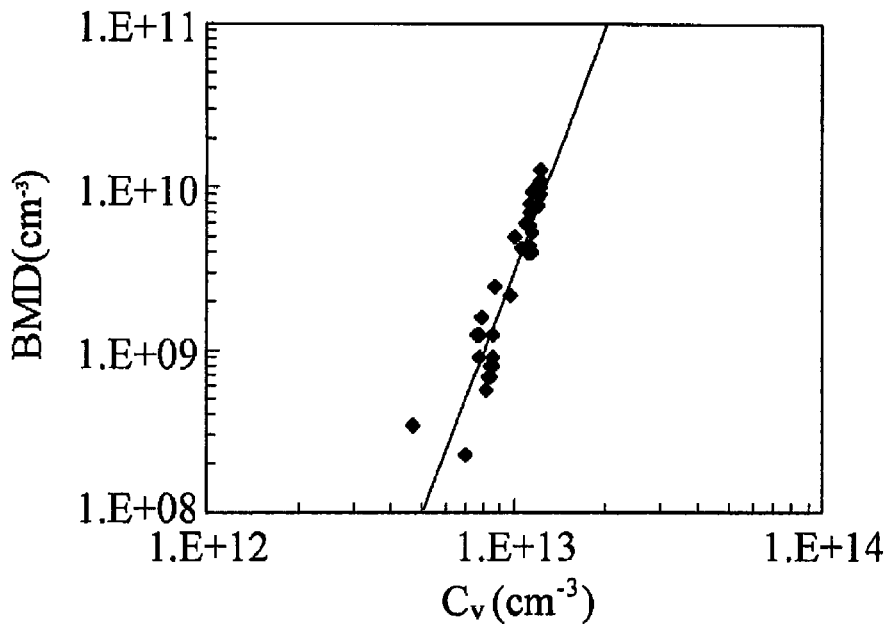
FIG. 7 is a diagram showing a relationship between a concentration of vacancies at the middle portion in a depth direction of a wafer found by numerical calculation, and BMD density in the Ar atmosphere RTA.
Figure 8:
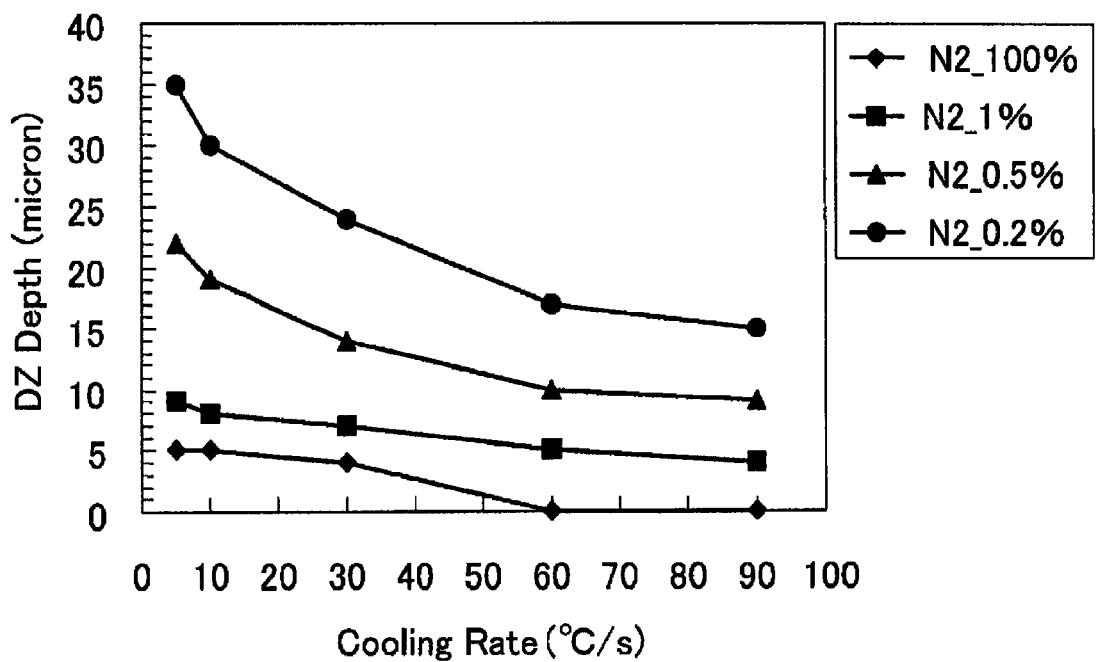
FIG. 8 is a diagram showing a relationship between the DZ depth, a cooling rate, and the partial pressure of nitrogen.
Figure 9A:
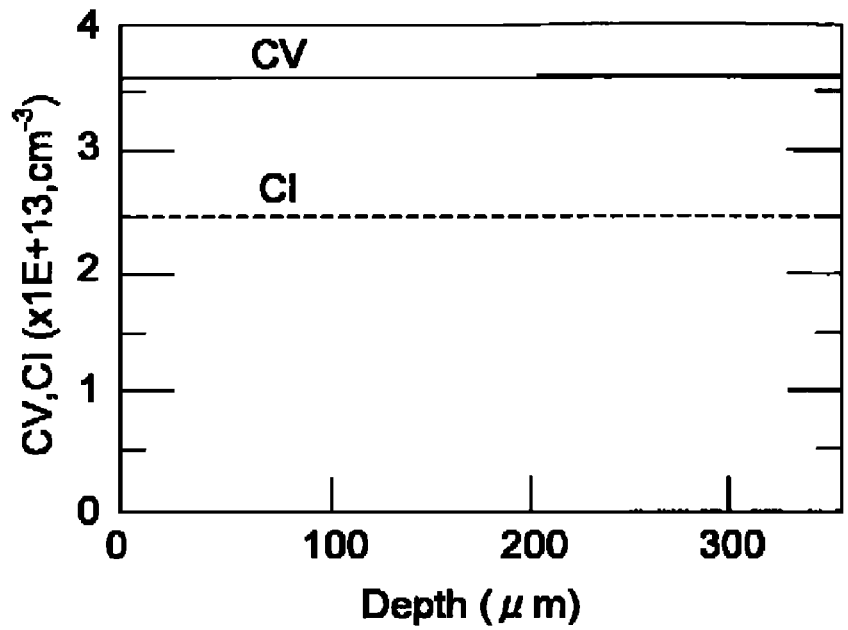
FIG. 9A is a diagram showing the density distributions of vacancy defects and interstitial silicon atoms in the depth direction of a wafer at a time of high-temperature retention in RTA in the Ar atmosphere.
Figure 9B:
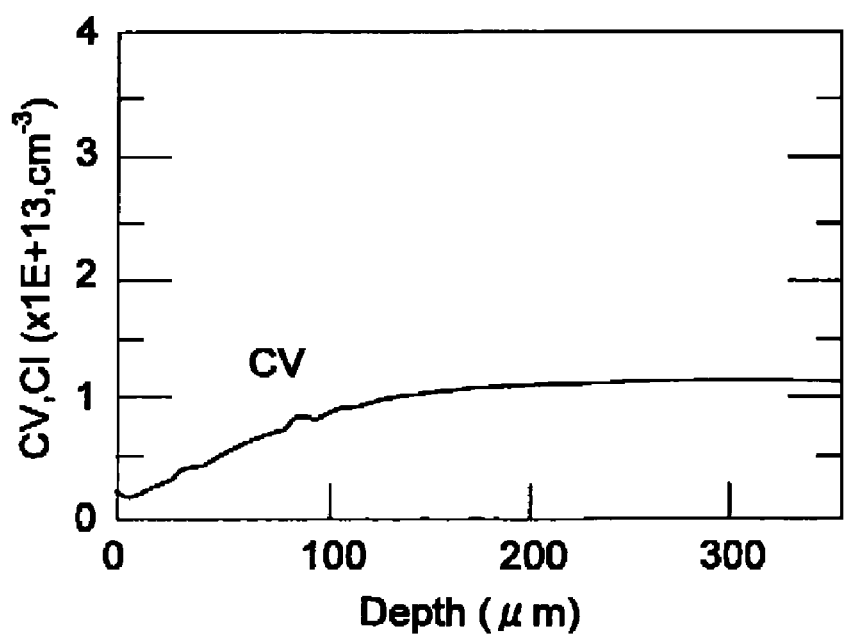
FIG. 9B is a diagram showing density distributions of vacancy defects and interstitial silicon atoms in the depth direction of a wafer after RTA in the Ar atmosphere.
Figure 10:
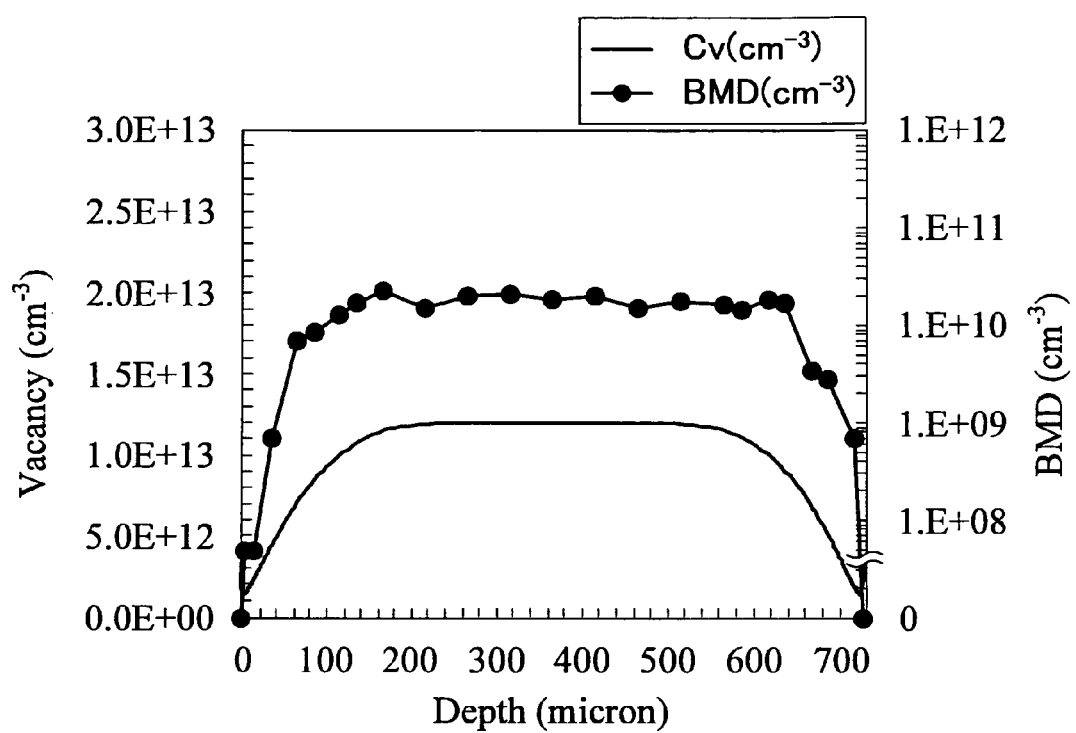
FIG. 10 is a diagram showing the density distributions of vacancy defects and a BMD density distribution in a depth direction of a wafer during and after RTA in the Ar atmosphere.
Figure 11A:
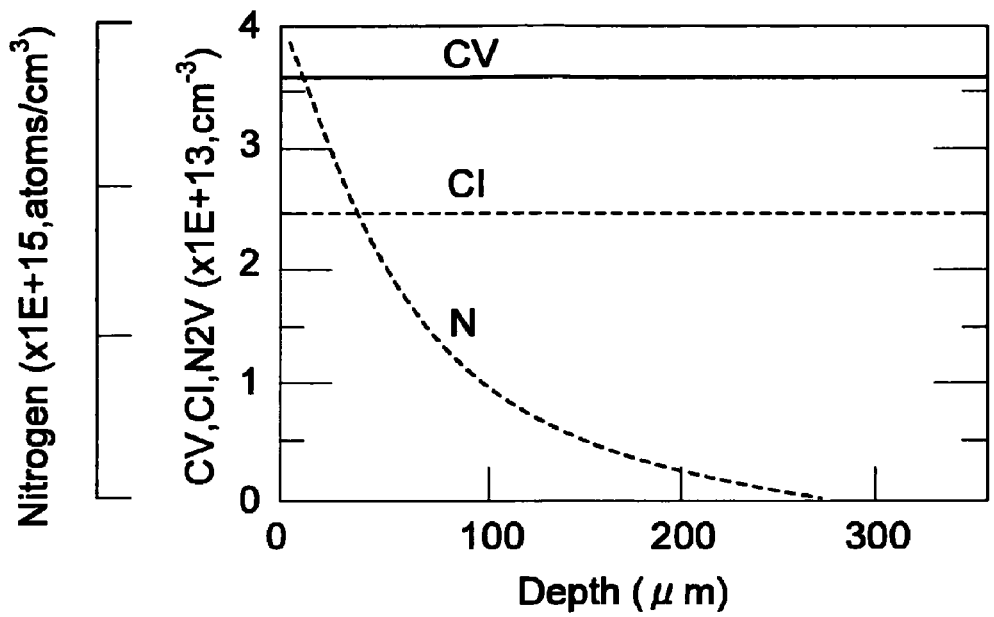
FIG. 11A is a diagram showing the density distributions of vacancy defects, interstitial silicon atoms, and N concentration in the depth direction of a wafer at the time of high-temperature retention in an RTA in the nitrogen atmosphere.
Figure 11B:
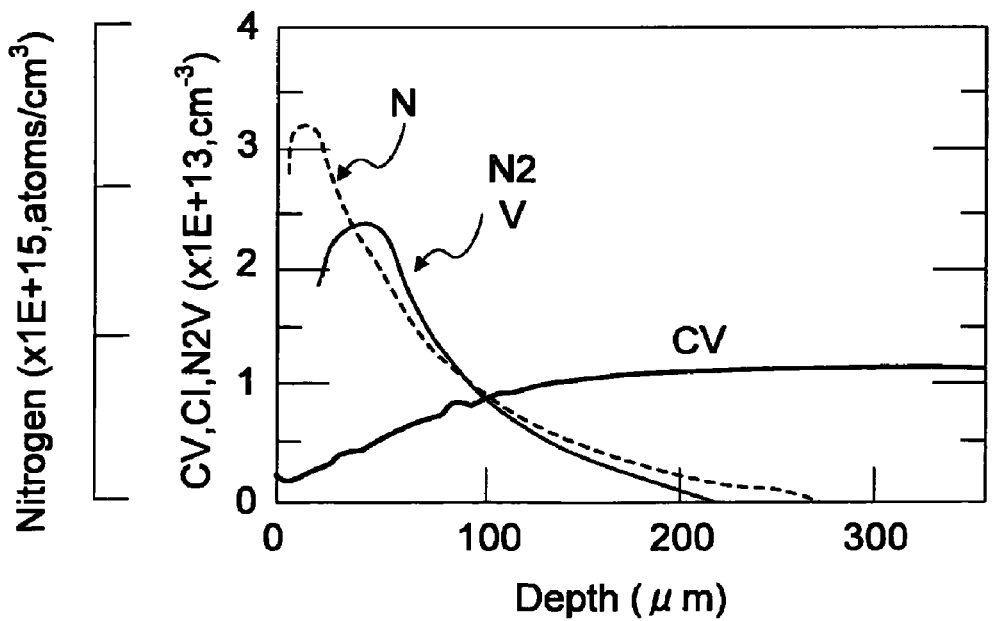
FIG. 11B is a diagram showing the density distributions of vacancy defects, N, and $N_2V$ in the depth direction of a wafer after RTA in the nitrogen atmosphere.
Figure 12:
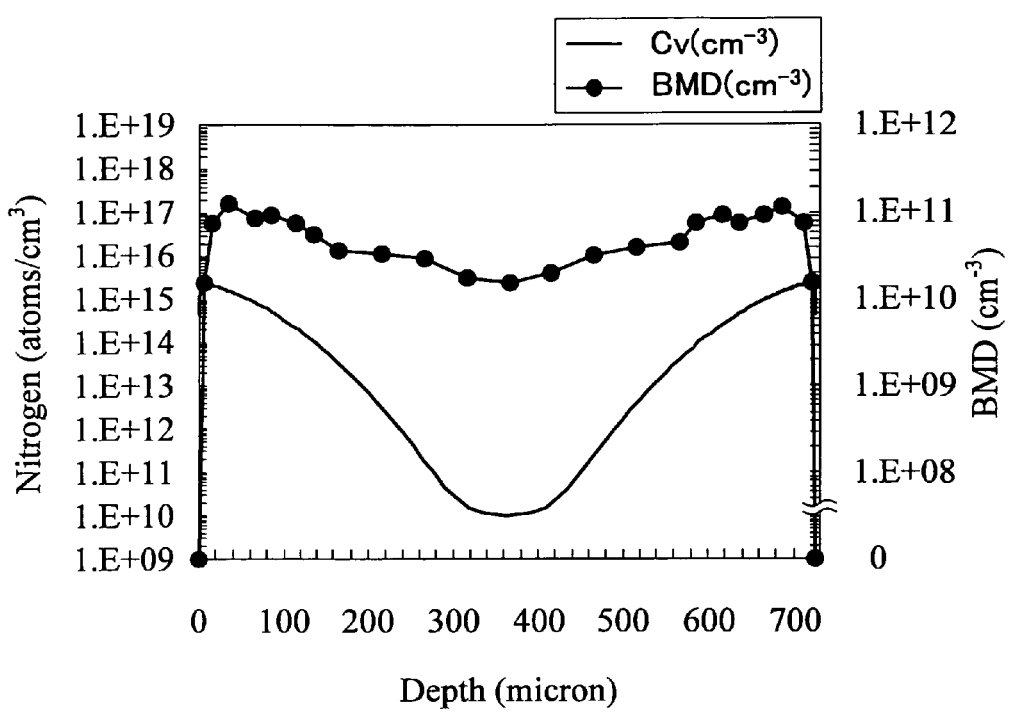
FIG. 12 is a diagram showing the density distributions of $N_2$ and BMD in the depth direction of a wafer during and after the RTA in the nitrogen atmosphere.

Then, with regard to the $BMD_{max}$, because this is a setting item in the vicinity of the surface of a wafer, the BMD density due to an Ar atmosphere is extremely low, and the BMD density due to a nitrogen atmosphere can be determined only by the nitrogen concentration. Hence, the corresponding nitrogen concentration can be determined from FIGS. 3A and 3B (S130). From this nitrogen concentration and the Xmax in the item (iii), a combination of a RTA holding temperature and a holding time, which satisfies both, can be found by numerical calculation of nitrogen diffusion (S140). Furthermore, a vacancy concentration ($C_V$) satisfying the $BMD_{in}$ in the above item (iv) is found from the relationship as shown in FIG. 7. From the combinations of the RTA holding temperature and the holding time, which were previously found, a RTA holding temperature and a holding time each satisfying the vacancy concentration ($C_V$) are determined. Thus, the present invention enables arbitrary formation of the M-shaped distribution of BMD density, based on the above-mentioned design procedure.

EXAMPLES

The present examples employ silicon wafers having a diameter of 200 mm. Similarly, silicon wafers having a diameter of 300 mm can be used. The followings are cases in which the above-mentioned four specifications required for devices are set as shown in Table 1, and these cases were practically carried out.

TABLE 1

| | Example 1 Partial pressure of nitrogen (%) | | | Example 2 RTA holding time (sec) | | |
|---|---|---|---|---|---|---|
| | 1 | 0.5 | 0.2 | 60 | 30 | 10 |
| $X_{dz}$ (μm) | 7 | 10 | 14 | 7 | 7 | 8 |
| $BMD_{max}$ (cm$^{-2}$) | 2.5E+07 | 1.6E+07 | 9.0E+06 | 2.7E+07 | 2.5E+07 | 2.3E+07 |
| $X_{max}$ (μm) | 40 | 45 | 50 | 50 | 40 | 20 |
| $BMD_{in}$ (cm$^{-2}$) | 6.0E+06 | 5.0E+06 | 4.0E+06 | 6.0E+06 | 6.0E+06 | 5.0E+06 |

Although a description will be made of examples using a mixed atmosphere of nitrogen and Ar, as a RTA atmosphere, the atmosphere gas is not limited to these, but is required to contain gas capable of diffusing nitrogen into a wafer. As a rapid temperature-increasing-and-decreasing apparatus for silicon substrates to be used in the present invention, an apparatus such as a lamp heater by thermal radiation, a high-frequency heating system, and the like are generally used. However, the heating system is not limited to these.

Example 1

Figure 15A:
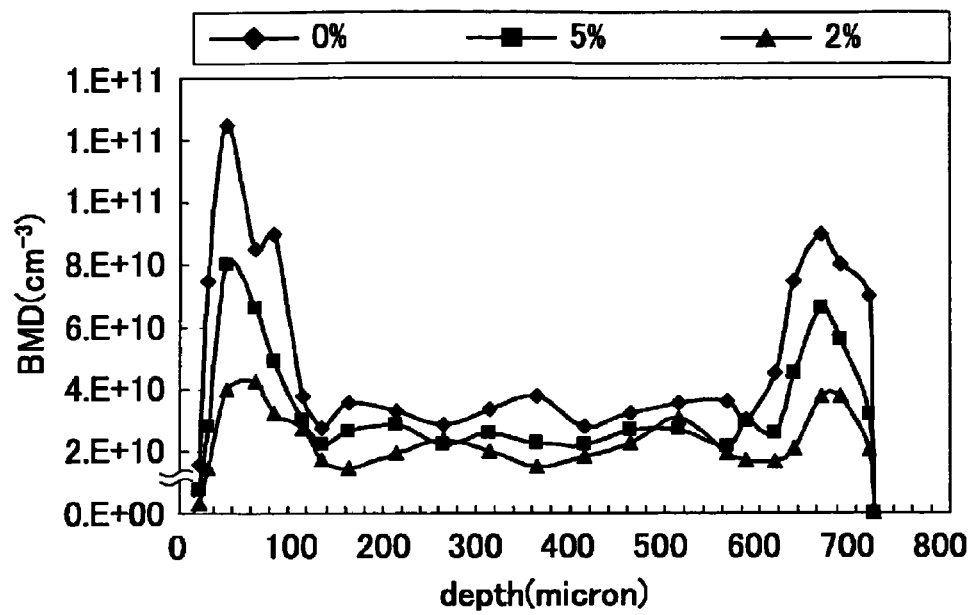
FIG. 15 is a diagram showing an M-shaped distribution obtained by arbitrarily controlling the maximum value of BMD density in the vicinity of the DZ by changing the partial pressure of nitrogen with respect to a silicon wafer, and the nitrogen concentration distribution in the depth direction of the wafer measured on SIMS.
Figure 15B:
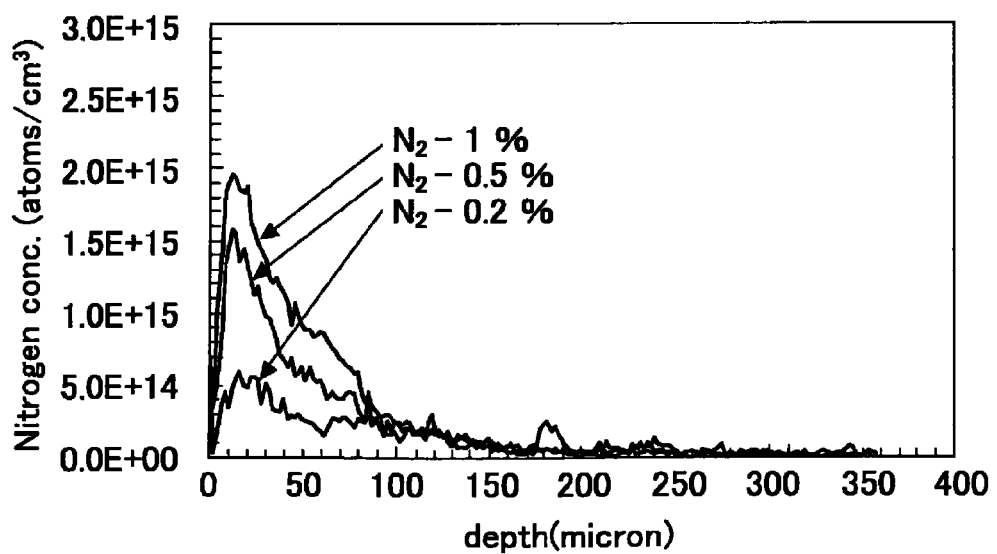

This is an example of using a mixed gas of nitrogen and Ar as a RTA atmosphere, and controlling an M-shaped distribution by the partial pressure of nitrogen. The following is such a method. The specifications of the used silicon wafer were 200 mm in diameter, p type in conductivity, 20Ω·cm in resistibility, <100> in crystal orientation, 14×10$^{17}$ atoms/cm$^3$ in initial oxygen concentration (an old ASTM). The partial pressures of nitrogen in the atmosphere were 0.2%, 0.5%, and 1%. In the RTA, the holding temperature was 1250° C., and the holding time was 30 sec, and the cooling rate from the holding temperature was 60° C./sec, which were standardized. After the RTA process, heat-treatments of 800° C. for four hours and 1000° C. for 16 hours were carried out, and BMD density was measured by selective etching method. FIG. 15A shows the profile in a depth direction of the silicon wafer having the obtained BMD density. It can be seen from FIG. 15A that the maximum value of the BMD density increases as the partial pressure of nitrogen increases. FIG. 15B shows the results of nitrogen concentration distributions in the depth direction of these silicon wafers measured on an SIMS. It can be seen from FIG. 15B that the profile in the depth direction of the BMD density in the vicinity of a peak closely resemble the profile of the nitrogen concentration diffusing inward from the atmosphere. Thus, by controlling the nitrogen concentration diffusing inward into the wafer from the atmosphere by using the partial pressure of nitrogen, the BMD density distribution can be changed arbitrarily to thereby control the maximum value of the BMD density in the vicinity of the DZ. This permits manufacturing of silicon wafers whose proximity gettering effect is changed arbitrarily.

Example 2

Figure 16A:
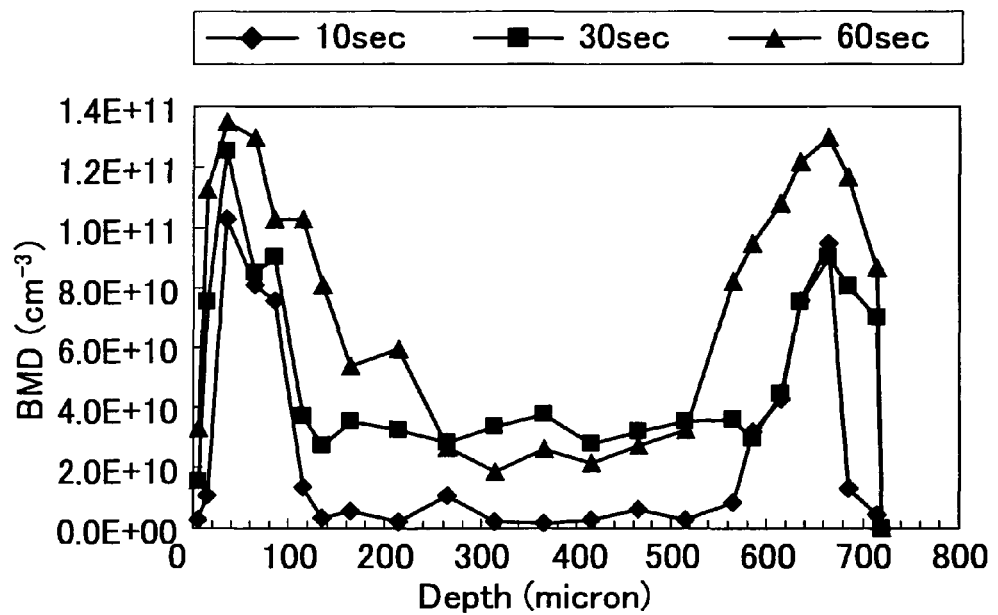
FIG. 16 is a diagram showing an M-shaped distribution in which the gradient in the depth direction of the BMD density from the immediately below the DZ to the interior of the wafer is arbitrarily controlled by changing the holding time, and the calculated nitrogen concentration distribution in a depth direction of a wafer.
Figure 16B:
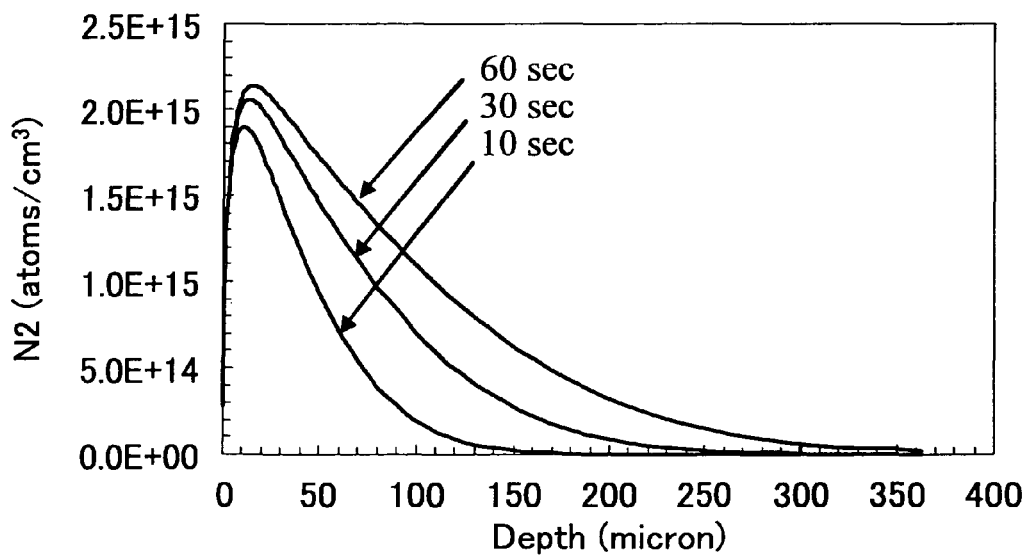

The next is an example of using a mixed gas of nitrogen and Ar as a RTA atmosphere, and controlling an M-shaped form by the RTA holding time. The following is such a method. The specifications of the silicon wafer used were identical with those used in Example 1. The RTA process time was changed to 60 sec, 30 sec, and 10 sec, in order to control the concentration of nitrogen diffusing from the atmosphere into the wafer. The holding temperature and the cooling rate from the holding temperature in the RTA were standardized at 1250° C. and 60° C./sec, respectively. The partial pressure of nitrogen in the atmosphere was fixed to 1%. After the RTA process, heat-treatments of 800° C. for four hours and 1000° C. for 16 hours were carried out, and the BMD density was measured by selective etching method. FIG. 16A shows the profile of the obtained BMD density in a depth direction of the silicon wafer. It can be seen from FIG. 16A that the maximum value of the BMD density in the vicinity of the DZ increases as the holding time increases, and that the gradient of the BMD density from the position indicating the maximum value of the BMD density toward the interior of the wafer decreases as the holding time increases. FIG. 16B shows the results of nitrogen concentration distributions in the depth direction of the silicon wafers at that time, which were obtained by calculation. The nitrogen concentration in the wafer surface used in the calculation was the thermal equilibrium concentration as given by Equation (2), and the diffusion coefficient D of nitrogen was given by Equation (3). It can be seen from FIG. 16B that the gradient of the BMD density from the wafer surface to its mid-portion is very similar to the calculated nitrogen concentration profile. Thus, under the control of the nitrogen concentration diffusing inward from the atmosphere into the wafer by using the RTA holding time, the BMD density distribution can be changed arbitrarily to thereby control the maximum value of the BMD density in the vicinity of the DZ, and the BMD distribution extending toward the interior. This permits manufacturing of silicon wafers whose mechanical strength is arbitrarily changed, while arbitrarily changing proximity gettering effect.

Figure 17:
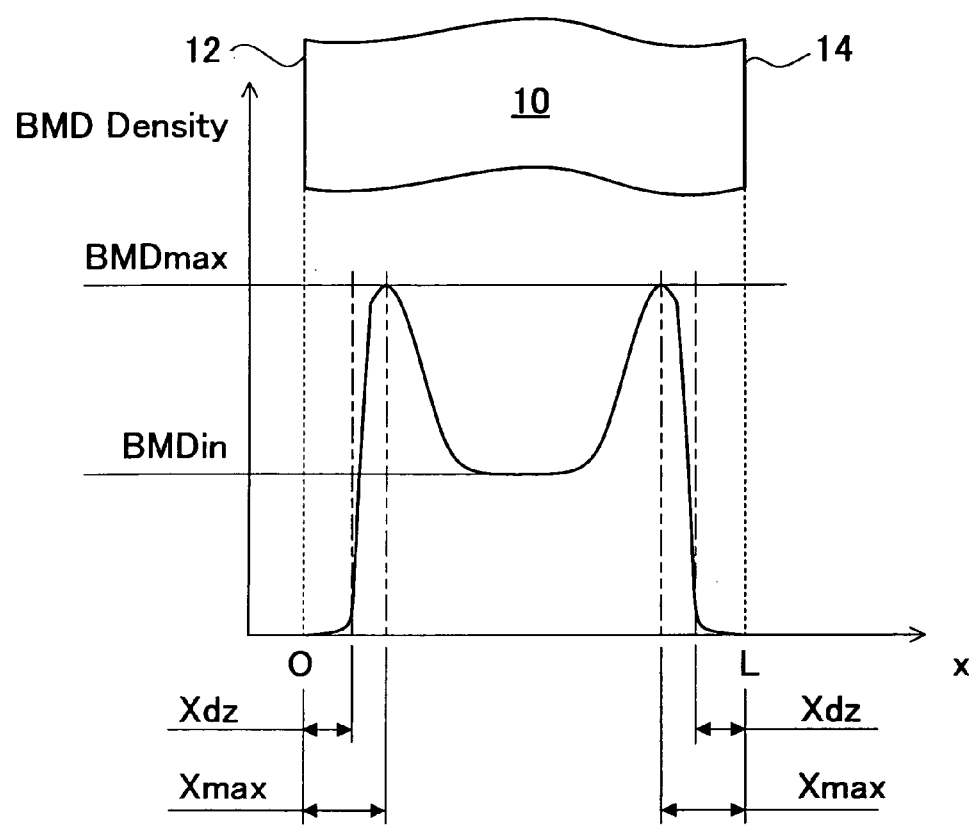
FIG. 17 is a diagram for explaining specifications to be set to a silicon wafer.

FIG. 17 illustrates the four items set as described above, namely (i) the DZ depth ($X_{dz}$), (ii) the peak BMD density in the vicinity of the surface ($BMD_{max}$), (iii) the depth from the surface of $BMD_{max}$($X_{max}$) and (iv) the internal BMD density ($BMD_{in}$). The silicon wafer 10 is schematically shown above the graph of FIG. 17, on which the abscissa represents the depth direction thereof. Thickness L of the silicon wafer 10 is expressed in L, as the X-coordinate of the right side surface 14 when the abscissa represents the left side surface 12 as reference. The ordinate of the graph represents the BMD density.

Thus, in accordance with the present invention, a desired BMD distribution can be achieved by controlling the nitrogen concentration distribution to a predetermined distribution. In addition, the M-shaped distribution in a depth direction of a wafer in the BMD density after the RTA in the nitrogen-containing atmosphere can be controlled arbitrarily. It is therefore capable of universally controlling proximate gettering structures, the need for which can vary from manufacturer to manufacturer.

While preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. Accordingly, the invention is not to be considered to be limited by the foregoing description and is only limited by the scope of the appended claims.

The invention claimed is:

1. A heat-treatment method for manufacturing a silicon wafer having a denuded layer in a vicinity of a surface thereof, the method controlling an internal defect density distribution to be formed accompanied by defect formation at least immediately below the denuded layer of the silicon wafer by controlling a nitrogen concentration distribution to be substantially M-shaped in a depth direction of the silicon wafer through controlling the concentration of nitrogen diffusing inward into the silicon wafer using a partial pressure of nitrogen by carrying out a heat-treatment using a gas atmosphere which allows nitrogen to diffuse into the silicon wafer.

2. The heat-treatment method according to claim 1, wherein the above-mentioned heat-treatment method determines rate of increase in temperature, holding temperature range, holding time, and rate of decrease in temperature of the heat treatment, and the heat treatment is carried out according to each of these determinations.

3. The heat-treatment method according to claim 2, wherein the above-mentioned heat-treatment method determines an internal defect density distribution in a depth direction of the silicon wafer, and after matching the internal defect density distribution and the nitrogen concentration distribution, in order to achieve the nitrogen concentration distribution, the partial pressure of nitrogen, the rate of increase in temperature, the holding temperature range, the holding time, and the rate of decrease in temperature are determined.

4. A heat-treatment method for manufacturing a silicon wafer with a denuded layer in a vicinity of a surface thereof and a defect lying in a interior of the wafer adjacent to the denuded layer, the method controlling a depth of the denuded layer and a defect density distribution in the interior of the wafer adjacent to the denuded layer, using a silicon wafer not doped with nitrogen, by controlling out-diffusion of vacancies of the silicon wafer during cooling and in-diffusion of nitrogen in the silicon wafer via a heat-treatment in which a gas atmosphere which allows nitrogen to diffuse in the silicon wafer is used.

5. The heat-treatment method according to claim 4 wherein after the heat-treatment, a state in which the nitrogen is penetrated to a position that is 10 μm in a depth direction from the surface of the silicon wafer, at which the nitrogen concentration is $1\times10^{14}$ atoms/cm$^3$ or more is provided.

6. The heat-treatment method according to claim 5, the heat-treatment comprising using a silicon wafer taken out of a single silicon crystal having an oxygen concentration of $9\times10^{17}$ atoms/cm$^3$ to $17\times10^{17}$ atoms/cm$^3$, and including a rapid temperature-increasing-and-decreasing heat-treating step, wherein the rapid temperature-increasing-and-decreasing heat-treating step includes a holding step of holding at a predetermined holding temperature for a predetermined holding time, the predetermined holding temperature being from 1100° C. to 1300° C., the holding time being from 1 to 300 seconds, a partial pressure of nitrogen percentage in a predetermined gas atmosphere being from 0.1 to 1 volume %, and a rate of decrease in temperature from the predetermined holding temperature having a range of 1 to 100° C./sec.

* * * * *